(12) United States Patent
Thalheim et al.

(10) Patent No.: US 7,728,680 B2
(45) Date of Patent: Jun. 1, 2010

(54) METHOD AND CIRCUIT CONFIGURATION FOR TRANSMITTING A TWO-VALUED SIGNAL

(75) Inventors: Jan Thalheim, Biel (CH); Sascha Pawel, Biel (CH)

(73) Assignee: CT-Concept Holding AG, Biel (CH)

( * ) Notice: Subject to any disclaimer, the term of this patent is extended or adjusted under 35 U.S.C. 154(b) by 145 days.

(21) Appl. No.: 11/826,001

(22) Filed: Jul. 11, 2007

(65) Prior Publication Data

US 2008/0068062 A1 Mar. 20, 2008

(30) Foreign Application Priority Data

Jul. 18, 2006 (CH) .................................. 01161/06

(51) Int. Cl.
*H03K 7/04* (2006.01)
*H03K 7/06* (2006.01)
(52) U.S. Cl. ..................... 331/74; 327/306; 332/114
(58) Field of Classification Search ............... 331/74; 327/306, 307; 332/114
See application file for complete search history.

(56) References Cited

U.S. PATENT DOCUMENTS 6,720,816 B2* 4/2004 Strzalkowski .............. 327/307

* cited by examiner

*Primary Examiner*—Robert Pascal
*Assistant Examiner*—James E Goodley
(74) *Attorney, Agent, or Firm*—Kenyon & Kenyon LLP

(57) ABSTRACT

The present invention relates to a method for transmitting a two-valued signal via a channel, a pulse train being output after the change of a signal level of the two-valued signal, and subsequently to the pulse train, a backswing is output. The present invention also relates to a circuit configuration for transmitting a two-valued signal having a magnetically coupled coil pair which includes an input coil and an output coil, at least two driver stages which are each connected to a terminal of the input coil, and an evaluation circuit which is connected to the terminals of the output coil, a capacitance being provided between a driver stage and a terminal of the input stage, and the input coil and the output coil each include two coil sections having windings in the opposite direction, the coil sections having the same winding direction of the input coil and the output coil being magnetically coupled.

15 Claims, 6 Drawing Sheets

METHOD AND CIRCUIT CONFIGURATION FOR TRANSMITTING A TWO-VALUED SIGNAL

FIELD OF THE INVENTION

The present invention relates to a method for transmitting a two-valued signal according to the definition of the species in Claim 1, a circuit configuration for transmitting a two-valued signal according to the definition of the species in Claim 16 and a magnetically coupled coil pair according to the definition of the species in Claim 25.

A two-valued signal is understood to mean a signal that is able to have a first signal level and a second signal level.

BACKGROUND OF THE INVENTION

In order for a circuit that generates a signal and a circuit driven by the signal to be separate with respect to potential, it is customary to use a potential barrier in the form of a magnetically coupled coil pair for signal transmission and energy transfer. The time-variable magnetic field of the coil pair switches between the galvanically separate circuits or system regions. One or more input coils function for each individual signal transmission as senders of the signal. The signal is coupled, by the magnetic field of the coil pair, to one or more coils that are instantaneously not emitting, which are used for signal reception (so-called output coils or receiver coils). One suitable circuit configuration on the output side or the receiver side extracts the originally sent signal, or rather its information content, from the output signal of the output coil.

In the case of the transmission of a two-valued signal, the emitted signal can include a continuous signal, a modulated signal and especially a pulse train or a single pulse. Single or a plurality of uncorrelated single pulses are usually emitted (FIGS. 2 and 4, uppermost signature) at a distance from one another that is long compared to the pulse duration.

Methods are known from US Patent Application 2005/0156699 A1 and Patent Document EP 0 935 263 B1 in which a coil pair is driven at a frequency at which the impedance of a coil pair equivalence circuit has its maximum and which is less than the resonant frequency of the coil pair. A larger number of exciting cycles from the sender side is required.

In the method of pulse pause modulation, in which the signal to be transmitted is coded two-valued or more-valued in the switch-on time and the switch-off time of continuously sent rectangular function, a large number of exciting cycles on the sender side is required (S. Zeltner, M. Billmann, M. März, E. Schimanek, "A compact IGBT driver for high temperature applications", Proceedings PCIM 2003, pages 211 to 216).

A method is known from U.S. Pat. No. 6,262,600 B1 in which a periodic signal is generated for the transmission of a two-valued signal via a potential barrier, whose frequency takes on two different values, depending on the frequency of the instantaneous level of the signal to be transmitted. Signals A simultaneous transmission of signal and energy via a common channel is possible using this method, just as in the case of the pulse-pause modulation method and the method depending on the resonant frequency of the coil pair. However, the methods lead to a high power loss, and the demodulation on the receiver's side requires the processing of a certain minimum number of signal cycles. This causes a delay in the transmission, as well as a certain uncertainty of the delay time (so-called jitter). The delay time can be reduced by raising the modulation frequency within the technical limits of the overall system. However, this can result in a further increase in the power loss.

If the single pulses are not sent in the form of a closed signal sequence, such as a sine wave, a rectangular function or the like, but separately from one another, the distance between the single pulses can be uniform, for example, (homogeneous pulse sequence) or the distance in time between respectively two subsequent pulses can be nonuniform, in that it increases with increasing distance in time from the preceding level change of the signal that is to be transmitted (DE 102 28 543 A1).

A transmission method is known from US Patent Application 2004/0101036 A1, in which a first channel and a second channel are used for the transmission. An announcing signal which includes at least one pulse is transmitted over the first channel. A data signal is transmitted within a time window over the second channel, the time window being open for a prescribed time duration after the announcing signal. The data signal can thereby be distinguished from possible interference signals. However, an additional expenditure on the system side is required, by making available two independent channels. Furthermore, interferences which occur after the time window has been opened and before it closes again are not filtered out, but can possibly affect the data signal. The wider the time window, the higher is the probability of the appearance of interferences. The probability of interference can be reduced by sending the data signal repeatedly.

A transmission method having one channel is known from US Patent Application 2003/0151442 A1, which incorporates the properties of the magnetically coupled coil pair used as transmitter. The slopes of the signal to be transmitted are converted to short pulses. Each pulse can be sent repeatedly to improve the security from interference. The magnetic transmitter translates the primary side pulses into the corresponding pulses on the secondary side. The maximum working frequency of the electronic circuit that drives the magnetic transformer is below the latter's working frequency range. For each pulse on the primary side there is a corresponding sequence of two pulses on the secondary side, the polarities of the pulses on the secondary side being reverse to one another. In the case of secondary pulses that appear in rapid succession, or in case of the simultaneous appearance of separate secondary pulses, an evaluation circuit prevents the passing along of the secondary pulses to a storage element.

In power electronics systems, transient voltages frequently occur between the primary and the secondary side, that is, between the input and the output side of a magnetic transformer (so-called dU/dt interferences). The time duration of these interferences is usually greater than the duration of the pulses on the secondary side. By raising the acquisition threshold of the evaluation circuit, an erroneous response of the evaluation circuit can be prevented, but at the same time the sensitivity of the evaluation circuit is also reduced. A second transmission pulse could also be sent after the decay of the interference which, however, would result in an increase in the signal run time.

Circuit configurations are known for driving the input coil of a magnetic transformer or a magnetically coupled coil pair in which each terminal of the input coil is connected to a power stage (for instance, using a full bridge circuit). Circuit configurations are also known in which only one terminal of the input coil is driven towards a fixed reference potential. Both circuit configurations can be operated both using direct current and alternating current. In the case of a direct current circuit, usually no capacitor is provided between the driver output and the terminal of the input coil, whereas in the case of an alternating circuit, a steady-state current flow through the input coil is prevented using a capacitor. Because of the decay of the current through the input coil caused by the charging of the capacitor, for each main pulse induced into the output coil, a counterpulse is created (a so-called backswing) having reverse polarity.

SUMMARY OF THE INVENTION

FIG. 1 shows a known circuit configuration 1 operated by direct current, having a magnetically coupled coil pair 2 which has a input coil 3 and an output coil 4, a driver stage being connected to a terminal of input coil 3 that is not shown in greater detail. The voltage $U_{DRIVER}$ generated by the driver stage has the form of pulses of equal time duration, whose spacing corresponds to the time duration of the pulses. As a result of the changes with time of the current through input coil 3, brought about by driver voltage $U_{TREIBER}$, a voltage $U_{OUT}$ is induced in output coil 4 which has a pulse per change in the signal level of driver voltage $U_{TREIBER}$, in response to a rising slope of driver voltage $U_{TREIBER}$ a pulse of positive polarity being generated and in response to a declining slope of driver voltage $U_{TREIBER}$ pulse of negative polarity being generated (cf. FIG. 2).

FIG. 3 shows a known alternating current circuit configuration 1 having a magnetically coupled coil pair 2 which has a input coil 3 and an output coil 4, a driver stage 5 being connected to each terminal of input coil 3. Driver stages 5 can be developed in the form of a full bridge circuit, for example. A capacitor $C_{TRENN}$ is provided between a terminal of input coil 3 and a driver stage 5. The two driver stages 5 connect in push-pull mode, that is, either the one driver stage 5 sends a signal $U_{TREIBER1}$ or the other driver stage 5 sends a signal $U_{TREIBER2}$, the signal being formed by a pulse in each case, whose time duration is constant. As soon as a signal level change has taken place, capacitor $C_{TRENN}$ recharges in the direction of the new steady-state final value of voltage $U_{EIN}$ that is present at the input coil, and a current flows through the input coil. The current increase brings about a pulse 6 on the output side (cf. FIG. 4). While the voltage increases over capacitor $C_{TRENN}$, the voltage dropping off over input coil 3, and the value of the current goes down. A backswing 7 is induced on the output side by the change in the value of the current.

It is the object of the present invention to create a method and a circuit configuration for transmitting a two-valued signal by which a great insensitivity to interferences and a low power loss are made possible.

It is also the object of the present invention to make available a magnetically coupled coil pair which stands out because of a high insensitivity to interferences.

The object is attained by a method having the features of Claim 1, a circuit configuration having the features of Claim 16 and a magnetically coupled coil pair having the features of Claim 25.

In the method according to the present invention, in order to transmit a two-valued signal over a channel, after the change of the signal level of the two-valued signal, a pulse train is emitted, and subsequently to the pulse train, a backswing is emitted. The expression "after a change" is also understood as meaning "upon a change". Let a pulse train be defined at present to mean that it includes at least two pulses. The pulses of the pulse train are preferably emitted directly one after another. In the method according to the present invention, the two-valued signal is preferably transmitted over a potential barrier, the potential barrier preferably including a magnetically coupled coil pair which has a capacitor preconnected on the input side.

Because of the use of only one channel for the transmission, the additional expenditure, which would be created, for instance, if two independent magnetic coupling elements were provided for transmission over two channels, is kept low. Because of the emission of a pulse train that is closed off by a backswing, a time window can be established during which the receiver side is able to receive a signal. In this way, the influence of brief, strongly fluctuating interferences, such as dU/dt interferences occurring in power electronics environments, is minimized. If a pulse of the pulse train is not correctly recognized, the subsequent pulses lend redundancy in the transmission.

Continuous transmission signals in the form of pulses of a pulse train are advantageously not used. Because of this, a so-called jitter, conditioned upon the system, can be avoided, and the power loss of the transmission can be reduced. A great robustness against interferences coupling in from system-conditioned or environment-conditioned magnetic fields, displacement currents and/or electromagnetic waves is attained. The method according to the present invention is particularly able to be used in the case of planar air coils which can be printed onto a printed-circuit board, so that magnetic flux guidance via ferrite or other highly permeable materials is not required.

In one specific embodiment of the method according to the present invention, for the generation of the pulse train, at least two driver stages that are provided on the input side of the coil pair, connect in such a way that at each switching process a current change of the same direction is generated by the capacitor, each current change of the coil pair generating one pulse of the pulse train. The driver stages convert the two-valued signal directly into corresponding transmission signals. A pulse modulation or the use of a so-called one shot timer can be omitted.

In one preferred specific embodiment of the method according to the present invention, in an initial state, a first driver stage outputs a first voltage value, and a second driver stage outputs a second voltage value that is different from the first voltage value. After a change in the signal level of the two-valued signal, the second driver stage outputs the first voltage value. After a specified time duration the first driver stage then outputs the second voltage value. In the case of an increasing slope of the two-valued signal, the first voltage level is preferably higher than the second voltage level, and in the case of a decreasing slope of the two-valued signal, the first voltage level is preferably lower than the second voltage level.

In one additional preferred specific embodiment of the method according to the present invention, in an initial state, a first driver stage outputs a first voltage value, and a second driver stage outputs a second voltage value that is different from the first voltage value. After a change in the signal level of the two-valued signal that is to be transmitted, the second driver stage outputs a third voltage value that is different from the first and the second voltage value. After a specified time duration, the first driver stage outputs the third voltage value, and after an additional specified time duration, the second driver stage outputs the first voltage value. Again, after a specified time duration, the first driver stage outputs the second voltage value. In a corresponding way, additional voltage values can be provided between which the driver stages can switch over.

Because of the number of voltage values which are output by the driver stages, correspondingly many pulses of a pulse train can be generated on the receiver side or output side. The second and all further pulses repeat the information that a change in the signal level has taken place in the two-valued signal that is to be transmitted. The time section during which the receiver side of the two-valued signal that is to be transmitted is prolonged by the outputting of a plurality of pulses. Consequently, possible interferences with the first pulse of the pulse train do not lead to an erroneous signal transmission, but can only lead to a run time extension by the time difference between the first and the second, or a later pulse of the pulse train that has not been interfered with.

In a still further specific embodiment of the method according to the present invention, using an evaluation circuit, the potentials of the outputs of the output coil of the magnetically coupled coil pair are compared to a reference potential in each case, while generating an evaluation signal for each. In the case of evaluation signals in the opposite direction, a valid signal transmission can be detected. A memory status can then be set or reset as a function of the evaluation signals. The reference potential is preferably formed by the average of the potentials at the terminals of the output coil. This is particularly of advantage for monolithically integrated circuit configurations.

In one further specific embodiment of the method according to the present invention, the reference potential is monitored for exceeding or falling below of specified threshold values, the processing of the potentials prevailing at the terminals of the output coil being interrupted in the case of the exceeding or the falling below. In this way, the interferences, particularly the so-called common-mode interferences, can be detected, and a further processing of a potentially invalid potential can be prevented.

In yet another preferred specific embodiment of the method according to the present invention, the evaluation signals are filtered using a filter. The filter is preferably designed so that pulses having a specified, low duration are suppressed. In this way, only briefly existing states that appear to be valid, which can be created, for instance, by the run time through the evaluation circuit, can be faded out. The output of the filter can then output the current logical state of the signal transmission path which is taken over into a memory and can be held there until the occurrence of a state change in the form of a change in the signal level of the two-valued signal that is to be transmitted.

The circuit configuration according to the present invention for transmitting a two-valued signal has a magnetically coupled coil pair, which includes a input coil and an output coil, at least two driver stages each connected to a terminal of the input coil, and an evaluation circuit that is connected to the terminals of the output coil. A capacitor is provided between the driver stage and a terminal of the input coil. The input coil and the output coil each include two coil sections having opposite winding directions, the coil sections having winding directions of the input coil and the output coil in the same direction being coupled magnetically to each other.

Magnetic field interference acting from the outside upon the input coil and/or the output coil of the magnetically coupled coil pair are preferably coupled into the coil sections having opposite winding direction in such a way that the resulting interference voltages induced in the output coil completely or partly cancel each other out. However, a transmitting device or a driver stage provided on the input side excite the input coil with a current in such a way that partial voltages induced in the output coils are superposed additively. The output voltage of the output coil of the magnetically coupled coil pair represents the sum of the voltages induced in the individual coil sections.

According to an exemplary embodiment of the circuit configuration according to the present invention, the terminals of the output coil are connected to one another via two, preferably equivalent resistors connected in series, a center terminal of the resistors being connected to a fixed potential. A favorable working point for the subsequent evaluation circuit can be set by the selection of the fixed potential.

According to an additional exemplary embodiment of the circuit configuration according to present invention, the evaluation circuit has one comparator per terminal of the output coil which is used for comparing the potential present at the respective terminal to a reference potential. The evaluation circuit is preferably developed in such a way the it forms the reference potential from the average value of the potential of the output coil. In this way an additional terminal can be spared, which is advantageous particularly for monolithically integrated circuit configurations.

According to a further exemplary embodiment, the comparators are designed so that they include a voltage offset at their respective inputs. The voltage offset is also designated as zero shift [or zero offset]. Differential input voltages below the voltage offset are not taken into consideration by the comparators. This leads to an increase in interference immunity.

According to yet another exemplary embodiment, a range monitoring or a monitoring circuit is provided which is used to monitor an ascertained reference potential for threshold value exceeding and/or undershooting. In this way, in the case of interferences, especially in the case of common-mode interference, further processing of the potentials prevailing at the terminals of the output coil can be prevented.

The magnetically coupled coil pair according to the present invention has an input coil and an output coil and is characterized by a capacitive shielding being provided between the input coil and the output coil, which is connected to a fixed potential, contacted at one end. The capacitive shielding is preferably developed as a finger-like structure. The finger-like structure can also be designated as a comb-like structure. The finger-like structure can, for instance, be developed of copper conducting strips.

Instead of the total capacitance prevailing between the input coil and the output coil of the magnetically coupled coil pair, there now acts only that proportion which feeds directly from the input coil to the output coil. This capacitive proportion is determined by those electrical field lines which, starting from the input coil do not end on the capacitive shielding. The geometrical arrangement of the capacitive shielding is preferred in such a way that this part of the field lines is considerably less than the total number of the field lines. The displacement current applied to the capacitive shielding is discharged counter to the selected fixed potential, and does not influence the further processing of the voltage induced in the output coil.

The design of the capacitive shielding as a finger-like structure, especially having narrow circuit board fingers, decreases the attenuation of the magnetic field fed by the input coil to the output coil, since because of this design, eddy current losses within the capacitive shielding can be decreased. Consequently, signal damping by induced eddy currents is minimized.

According to another exemplary embodiment of the magnetically coupled coil pair according to the present invention, a magnetic shielding, particularly a massive conductive flat piece is assigned to the output coil and/or the input coil for protection from magnetic interference fields. For this, a massive conductive flat piece can be applied, spatially close to the output coil and/or the input coil, but not between the output coil and the input coil. The magnetic shielding can include printed circuit card base material (such as the fiberglass composite material FR4) and a conductive layer made of copper, for instance. The eddy currents produced in the shielding by a magnetic pulsating field from the environment shield the immediate environment of the shielding. The strength of the massive conductive flat area determines the efficiency of the shielding at a given frequency of the interference coupling in.

The magnetically coupled coil pair according to the present invention can be advantageously used in the circuit configuration according to the present invention.

BRIEF DESCRIPTION OF THE DRAWINGS

Further advantageous embodiments of the present invention are yielded by the dependent claims and by the exemplary embodiments shown below with the aid of the drawings. The figures show:

In the figures, like reference numerals designate like or functionally equivalent components.

DETAILED DESCRIPTION

FIGS. 1 through 4 are described in the introduction to the specification, in connection with acknowledging the related art. We refer the reader to these parts of the description.

Figure 1:
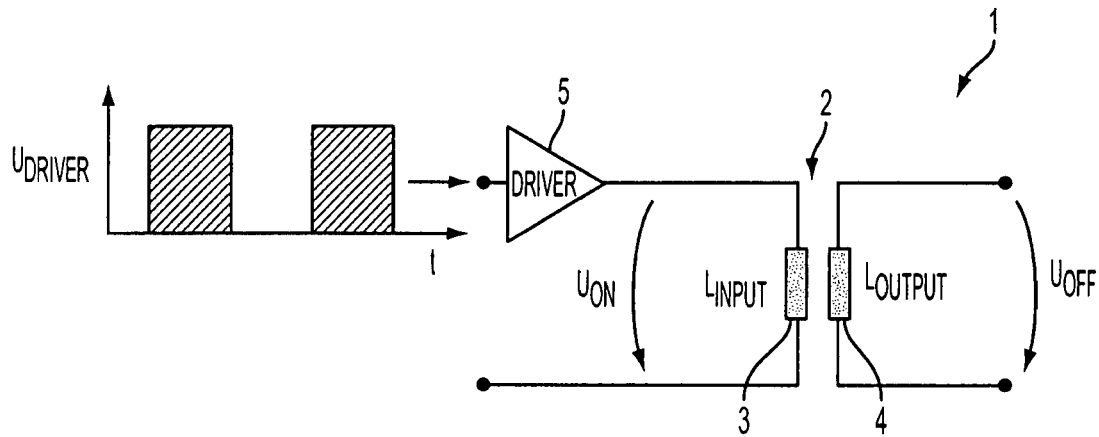
FIG. 1 a circuit configuration known from the related art, for transmitting a two-valued signal, FIG. 2 the curve of signals in the circuit configuration as in FIG. 1, FIG. 3 an additional circuit configuration known from the related art, for transmitting a two-valued signal, FIG. 4 the curve of signals in the circuit configuration as in FIG. 3, FIG. 5 an exemplary embodiment of a circuit configuration according to the present invention, FIG. 6 an additional exemplary embodiment of a circuit configuration according to the present invention, FIG. 7 the curve of signals in the circuit configuration as in FIG. 6, FIG. 8 an additional exemplary embodiment of a circuit configuration according to the present invention, FIG. 9 an exemplary embodiment of a magnetically coupled coil pair according to the present invention and FIG. 10 a further exemplary embodiment of a magnetically coupled coil pair according to the present invention.
Figure 2:
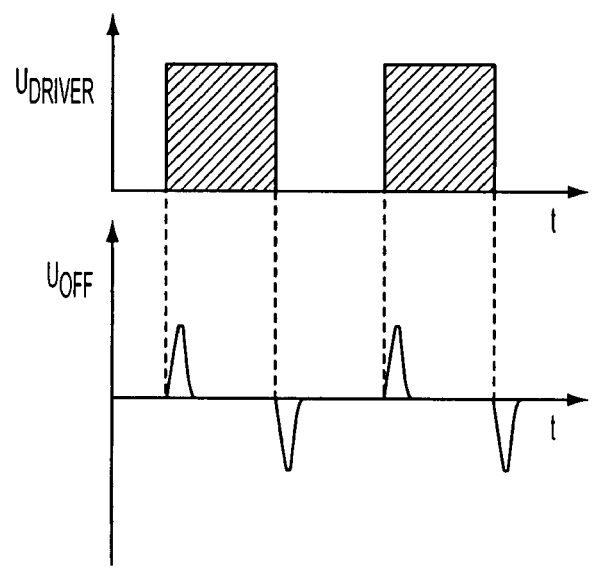
Figure 3:
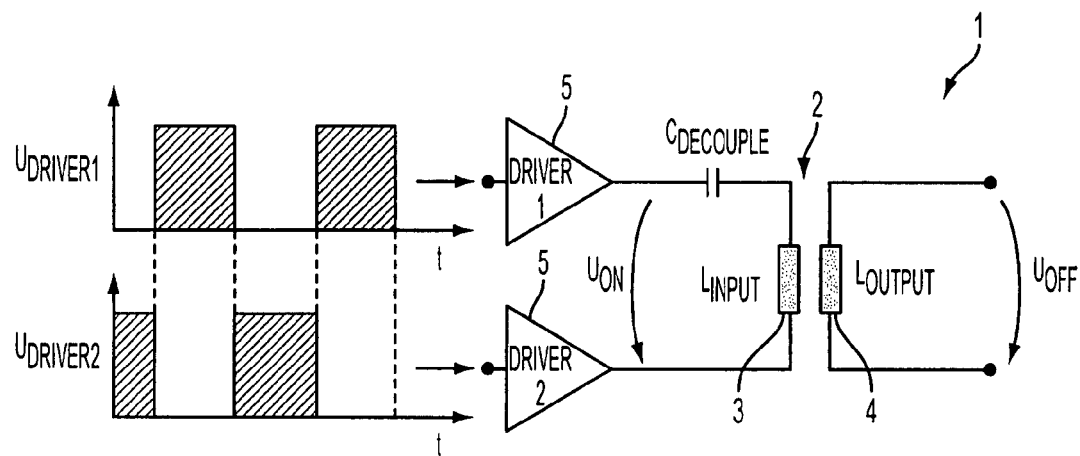
Figure 4:
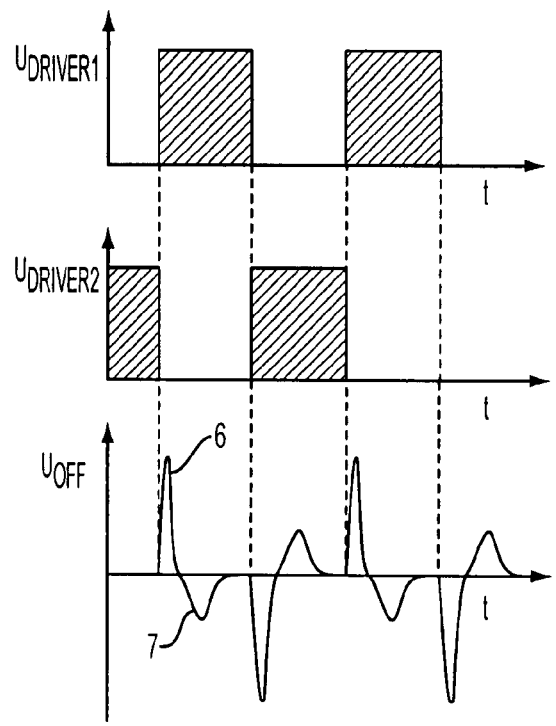
Figure 5:
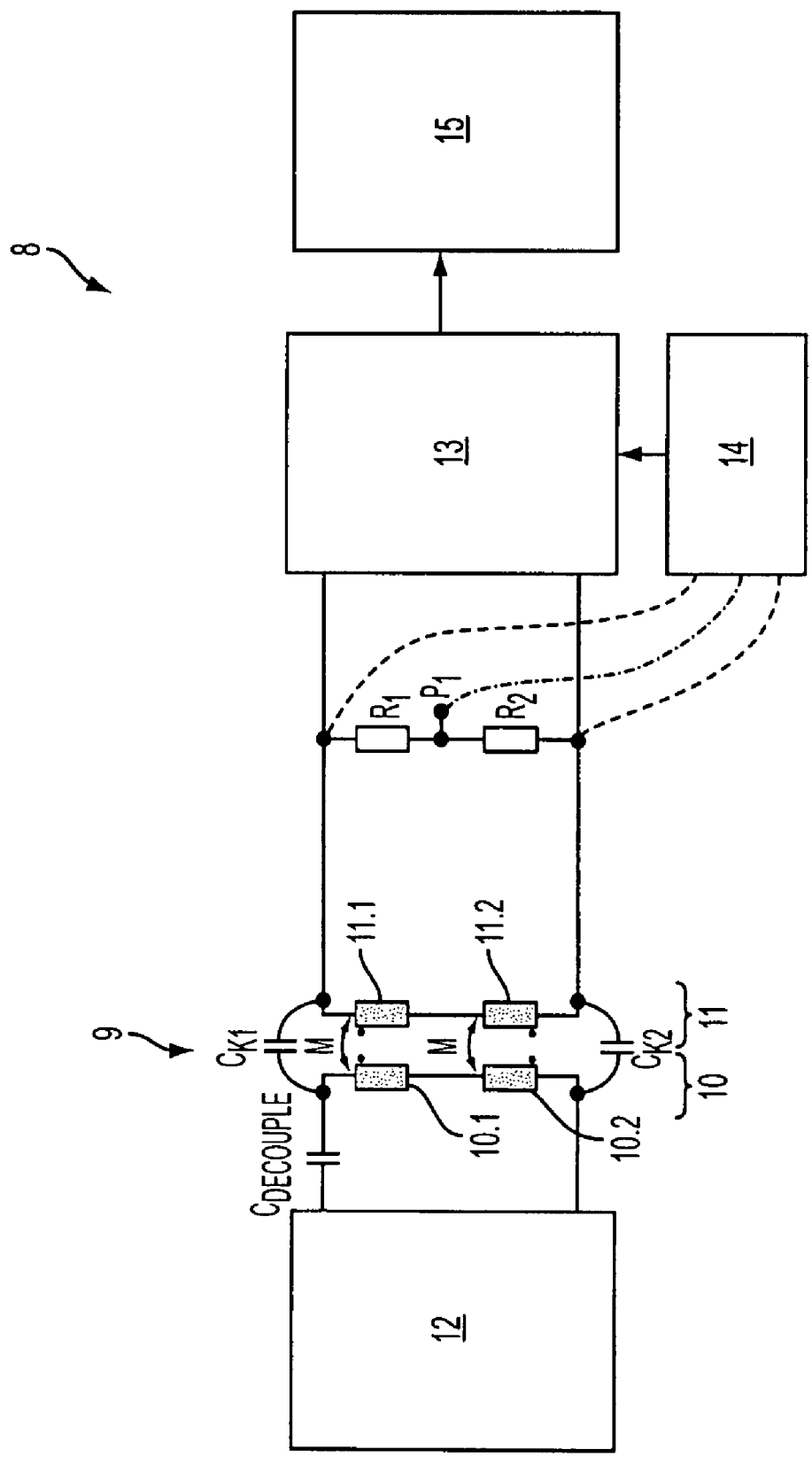

FIG. 5 shows an exemplary embodiment of a circuit configuration 8 according to the present invention. A magnetically coupled coil pair 9 is provided which has an input coil 10 and an output coil 11. A transmitting device 12 is provided, via which a two-valued signal that is to be transmitted is fed into circuit configuration 8. A capacitance, in particular a decoupling capacitance $C_{TRENN}$, is provided between the output of transmitting device 12 and an input of input coil 10. Transmitting device 12 preferably has a driver stage, not shown, for each terminal of input coil 10. The terminals of output coil 11 are connected to inputs of a receiver device, that is not designated more closely, which includes an evaluation circuit 13, to which a filter can be assigned.

Magnetically coupled coil pair 9 illustrates a differential magnetic device. Input coil 10 and output coil 11 each include two coil section 10.1, 10.2 and 11.1, 11.2 having opposite winding directions, that is, coil sections 10.1 and 10.2 of the input coil are wound in opposite directions, and coil sections 11.1 and 11.2 of output coil 11 are also wound in opposite directions. Coil sections 10.1 and 11.1 and 10.2 and 11.2 of the input coil and the output coil are coupled magnetically with each other. This means, coil section 10.1 of input coil 10 is coupled magnetically with coil section 11.1 of output coil 11. Correspondingly, coil section 10.2 of input coil 10 is coupled magnetically with coil section 11.2 of output coil 11. The center terminals of the coil sections connected in series, that are provided between coil sections 10.1 and 10.2, and 11.1 and 11.2, are not connected to transmitting device or receiving device 12, 13 or to another connecting point of circuit configuration 8 outside coil pair 9. This means that the center terminals of coil sections 10.1 and 10.2, and 11.1 and 11.2, that are connected in series, are not tapped.

An overall reversal of the winding directions of coil sections 10.1, 10.2, 11.1, 11.2 of magnetically coupled coil pair 9 is possible. The mutual inductance of magnetically coupled coil pair 9 is designated by M. The mutual capacitance of magnetically coupled coil pair 9 is designated by $C_{K1}$ and $C_{K2}$.

The magnetic field interferences, acting from the outside, couple into the opposite direction oriented coil sections 10.1 and 10.2, and 11.1 and 11.2 in such a way that the resulting interference voltages induced in output coil 11 cancel each other out. By contrast, if transmitting device 12 feeds a current into input coil 10, the partial voltages of coil sections 11.1 and 11.2 induced in output coil 11 are superposed in an additive manner.

Two resistors $R_1$ and $R_2$ connected in series, which preferably have the same value, are situated in parallel to output coil 11 and connected to the latter's terminals, so that the output voltage of output coil 11 drops off over them. The connecting point lying between resistors $R_1$ and $R_2$ is connected to a fixed potential $P_1$. Potential $P_1$ can be formed, for example, by the operating voltage on the output side. A favorable working point for the following receiver device and evaluation device 13 can be set by the selection of potential $P_1$.

The evaluation of the output voltage dropping off over output coil 11 takes place by the comparison of each of the two potentials of the terminals of output coil 11 to a reference potential. The reference potential preferably is in a fixed ratio to potential $P_1$ of the connecting point between resistors $R_1$ and $R_2$. Potential $P_1$ can be used as the reference potential. Alternatively, potential $P_1$, and thus the reference potential, can be formed from the potentials of the terminals of output coil 11, for instance, by an average value formation.

Signals to be transmitted by transmitting device 12 couple into output coil 11 as differential quantities and cause overall voltage drop over the latter, whereas, for example, interferences coupling in as common-mode signals, especially so-called dU/dt interferences, essentially give rise to no potential difference, or only a small one, between the terminals of output coil 11. The energy of the interference signal is dissipated essentially symmetrically from both resistors $R_1$ and $R_2$ opposed to potential $P_1$.

Evaluation circuit 13 compares the potential present at each terminal of output coil 11 to the reference potential and emits a logical signal for each of the comparisons. Conditioned upon the fact that output coil 11 includes two coil sections 11.1 and 11.2 having opposing winding directions, the potentials at the terminals of output coil 11 deviate in the opposing direction from the reference potential as soon as a signal is transmitted. Interferences such as capacitive current injections on the terminals of output coil 11, on the other hand, typically lead to an equidirectional potential change at the terminals of output coil 11 (so-called common-mode interference). Such interference injections are taken into account in FIG. 5 by the parasitic coupling capacitances $C_{K1}$, and $C_{K2}$ of the magnetically coupled coil pair, in each case one coupling capacitance $C_{K1}$, and $C_{K2}$ connecting respectively one terminal of input coil 10 to a terminal of output coil 11. Consequently, sent signals can be distinguished from interference effects from the system environment, since, when a signal is sent, the potentials at the terminals of the output coil behave in the opposite direction, whereas in the case of an interference effect, the potentials change in the same direction.

Because of interferences, especially the above-described common-mode interferences, it can happen that the potentials at the terminals of output coil 11 assume values that can exceed the working range of evaluation circuit 13. In such a case, a secure signal evaluation would be in danger, since the interferences would be included in the reference potential, formed from the potentials, that is, formed as the arithmetic average of the potentials. To avoid this, circuit configuration 8 includes a range monitoring 14, whose inputs are preferably connected to the terminals of output coil 11 and potential $P_1$.

If it is detected, using range monitoring 14, that the reference potential exceeds and/or falls below specified threshold values, further processing of the potentials present at the terminals of output coil 11 is prevented. Range monitoring 14 preferably emits an appropriate signal for this to evaluation circuit 13. Using logical linkage, the output signals of evaluation circuit 13 and of range monitoring 14 are evaluated, a valid signal transmission being detected in the case of output signals of evaluation circuit 13 at opposite directional polarity, and simultaneous non-exceeding of the threshold values by the reference potential. The output signal detected as being valid is submitted to filtering using a filter that is not shown, in order to filter out output signals that are short-term and appear to be of valid status, which can be created as a result of run times through the circuit configuration. At the output of the filter, the current logical state of the circuit configuration and the current value of the two-valued signal, that is to be transmitted, are subsequently able to be tapped off. This value is transferred to a memory 15, or rather, memory 15 is appropriately set until a change in the signal level of the two-valued signal, that is to be transmitted, takes place. Then memory 15 is reset.

Figure 6:
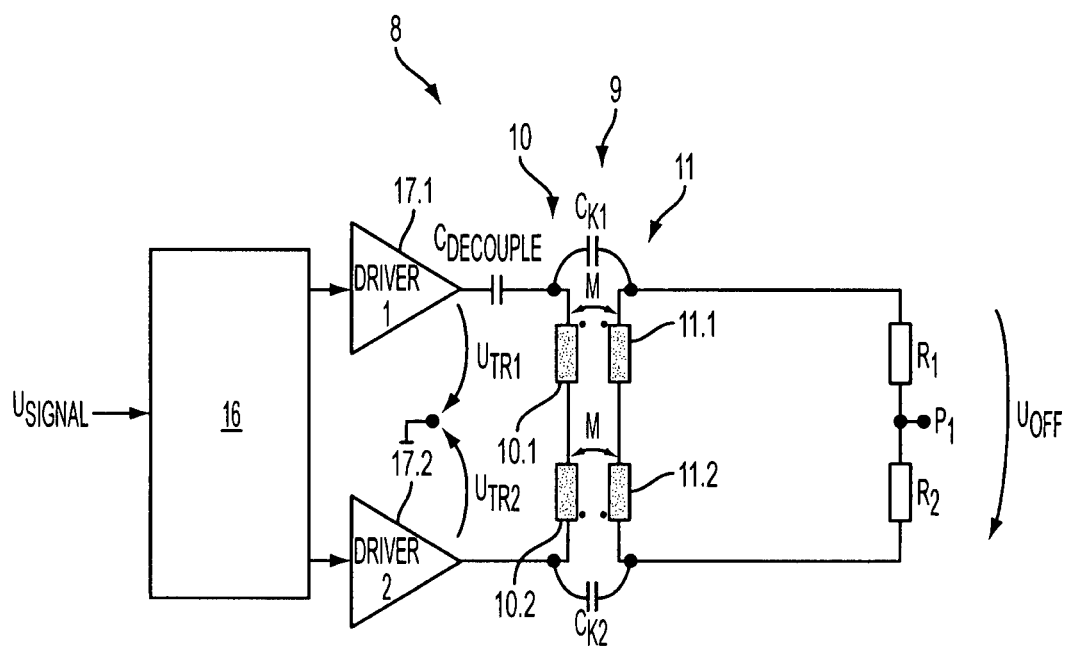

FIG. 6 shows an additional exemplary embodiment of a circuit configuration 8 according to the present invention, the evaluation circuit, the range monitoring and the memory not being shown, for the sake of simplicity. Circuit configuration 8 corresponds essentially to the circuit configuration shown in FIG. 5, transmitting device 12 being shown as control circuit 16 having two post-connected driver stages 17.1, 17.2; each driver stage 17.1, 17.2 being connected to an output of control circuit 16 and a terminal of input coil 10. Decoupling capacitance $C_{TRENN}$ is situated between the output of a driver stage 17.1 and a terminal of input coil 10.

Control circuit 16 converts a two-valued input signal $U_{SIGNAL}$, that is to be transmitted, to corresponding driver voltages $U_{TREIBER1}$ and $U_{TREIBER2}$. Driver voltages $U_{DRIVER1}$, $U_{DRIVER2}$ occur between the output of a driver stage 17.1, 17.2 and ground.

Figure 7:
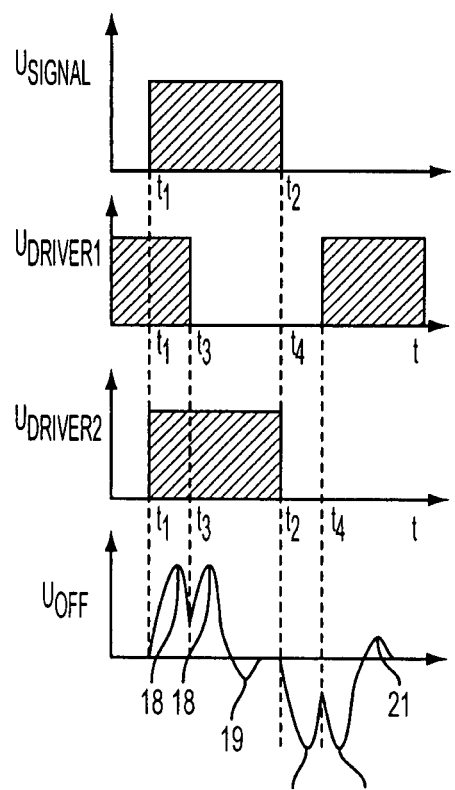

FIG. 7 shows exemplary curves of signals appearing in circuit configuration 8 as shown in FIG. 6. In an initial state, a first driver stage 17.1 outputs a first voltage value, which is preferably positive. The second driver stage outputs a second voltage value which is less than the first voltage value. In the initial state, the second driver stage preferably emits a voltage value of 0 volt. Consequently, in the initial state, a constant voltage is present over capacitance TRENN; no current flows. In the initial state, the first driver stage is thus operated, so to speak, in logical state high, whereas second driver stage is operated in logical state low. At point $t_1$, at which two-valued signal $U_{SIGNAL}$ has a change in signal level (here, for example, a rising slope), control circuit 16 switches second driver stage 17.2 to logical high, so that it outputs the first voltage value that corresponds to the voltage value that first driver stage 17.1 outputs. This has the result that the voltage dropping off over capacitance $C_{TRENN}$ transiently goes over to a new value which, in turn, results in a current flowing into input coil 10, which causes a positive voltage pulse 18 in the output coil. At a freely selectable, predefined time $t_3$, control circuit 16 switches first driver stage 17.1 to logical low, that is, first driver stage 17.1 now outputs voltage value 0. The result is that a voltage is created once again over decoupling capacitance $C_{TRENN}$ which, as before, permits a current to flow through input coil 10. Thereupon, a second positive voltage pulse 18 drops off over output coil 11.

With these two pulses 18, the transmitting procedure for the change in the signal level of two-valued signal $U_{SIGNAL}$ is closed for the case of two-valued outputs of driver stage 17.1 and 17.2. The current introduced into input coil 10 continues to flow until a constant voltage drops off again over capacitance $C_{TRENN}$ which corresponds to the state of the outputs of driver stage 17.1 and 17.2, A reduction in the current through input coil 10 leads to an increase in the self-induction voltage of input coil 10, which counteracts the reduction of the current through input coil 10. The reduction in the current causes a negative voltage pulse in output coil 11, which acts as backswing 19 to the two voltage pulses 18 that occurred before.

Specified time $t_3$, at which driver stage 17.1 switches over to 0 volt, is preferably substantially greater than the usual cross-interlocking circuit time between two driver stages. The elapsed time between the switching over of second driver stage 17.2 and first driver stage 17.1, $t_3$-$t_1$ can be dimensioned at, for instance, 200-300 ns in such a way that interferences, particularly common-mode interferences, are not able to occur at all or essentially not during the entire time duration.

For the transmission of a change in the signal level having opposite directional polarity (here, for instance, a declining slope), driver stages 17.1 and 17.2 are controlled using correspondingly inverted logical levels or voltage values by control circuit 16. Now, in the initial state, driver stage 17.1 is on logical low and it outputs a voltage value of 0 volt, while second driver stage 17.2 is at logical high, that is, it outputs a first positive voltage value. It should be noted at this point that the designations only positively and negatively have a descriptive, exemplary character.

At or after a change in signal level (here, for instance, a declining slope) at time $t_2$, second driver stage, controlled by control circuit 16, switches over from logical high to logical low, that is, it outputs a voltage value of 0 volt. Now, after a specified time duration of $t_4$-$t_2$, first driver stage 17.1 switches over to logical high, that is, it outputs a first positive voltage value. In each case, at the switchover points of driver stages 17.1 and 17.2, a voltage pulse 20 of negative polarity is induced in output coil 11, the last voltage pulse 20 in time being followed by a backswing 21, of positive polarity, which is based on a decaying current through input coil 10.

In the method according to the present invention, for each change in the signal level of the two-valued signal that is to be transmitted, two (voltage) pulses are induced in output coil 11. Compared to the induction of only one pulse, this results in an increase in the time duration during which a change in the signal level of the two-valued signal, that is to be transmitted, is able to be detected by a receiver circuit situated at the output side of coil pair 9. Basically, the first in time of the two voltage pulses 18 and 20 is already sufficient for the detection of a change in the signal level. The transmission of this information is repeated by the second or additional pulses

18, 20. This extends the time duration during which the signal level change is able to be detected. A time window, so to speak, is established for the transmission of the signal level change. Possible interferences of first pulse 18, 20 therefore do not lead to an erroneous signal transmission, but the change in the signal level can still take place by the evaluation of the second or additional pulses 18, 20.

In the case of driver stages that are able to output more than two voltage values, the method according to the present invention can take the following form: Let us assume, for example, three driver stages having three-valued driver outputs having output voltage values 0 volt, $U_1$ and $U_2$, voltage values $U_1$ and $U_2$ being positive voltage values and voltage value $U_2$ being greater than voltage value $U_1$. In response to appropriate control of the driver stages, a pulse train consisting of four consecutive pulses followed by a backswing can be generated in output coil 11. Initially, the first driver stage outputs voltage value $U_2$, whereas the second driver stage outputs a voltage value of 0 volt. Upon a change in the signal level, especially in the case of a rising slope of the two-valued signal, that is to be transmitted, the second driver stage switches over to voltage value $U_1$. This generates a first voltage pulse in output coil 11. After a specified time duration, the first driver stage switches over to voltage value $U_1$. This generates a second voltage pulse in output coil 11. After a further specified time duration, the second driver stage switches over to voltage value $U_2$. This generates a third voltage pulse in output coil 11. After a further specified time duration, the first driver stage switches over to voltage value 0. This leads to the generation of a fourth voltage pulse in output coil 11. The voltage pulses generated all have the same polarity.

The sequence of the switching processes of the driver stages can be varied as desired, as long as the change in the current flow through capacitance $C_{TRENN}$, caused by the change in the output voltage of the driver stages, has the same polarity as the preceding current change. The driver stages are controlled correspondingly, inversely for the complementary change in the signal level, particularly in the case of a diminishing slope of the two-valued signal that is to be transmitted. In an analogous manner, by the insertion of additional output levels of the driver stages, any number of successive pulses of the same polarity can be generated if they are followed by a backswing of the opposite polarity. The offset in time between the switching processes of the driver stages, which lead to a pulse train induced in output coil 11, is preferably substantially longer than the usual interlocking circuit time within the driver stages and between them.

Figure 8:
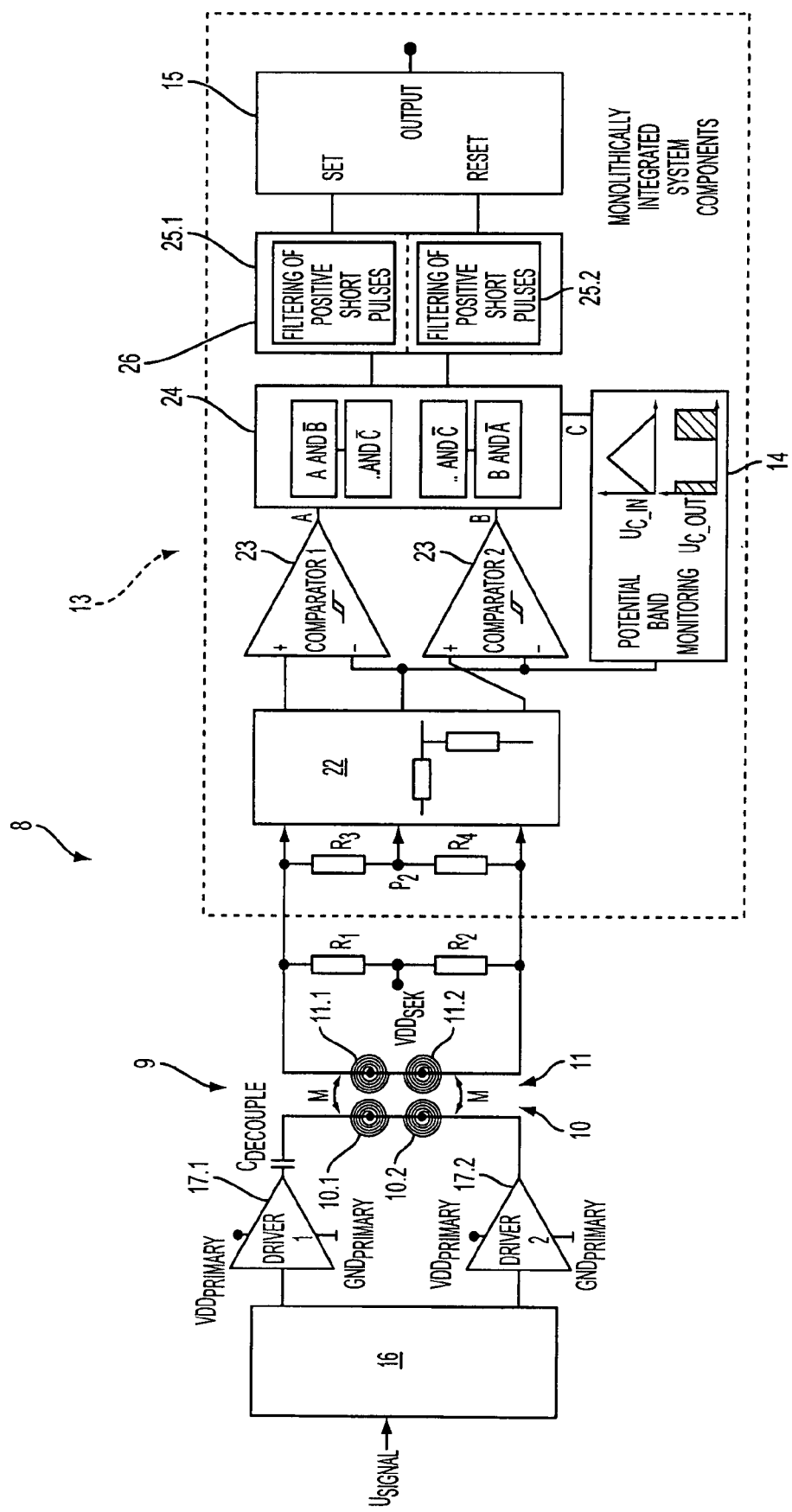

FIG. 8 shows an additional exemplary embodiment of a circuit configuration 8 according to the present invention, which, as compared to the exemplary embodiments shown in FIGS. 5 and 6, include a voltage divider 22 and a detailed representation of evaluation circuit 13. Depending on the control by control circuit 16, driver stages 17.1 and 17.2 guide two-valued signal $U_{SIGNAL}$ either to potential $vdd_{PRIM}$ or potential $gnd_{PRIM}$.

From the feeding in of the two-valued signal to the dielectric decoupling between input coil 10 and output coil 11, the designation primary side of circuit configuration 8 can also be chosen. The side between the dielectric decoupling of input coil 10 and output coil 11 and memory stage 15 of circuit configuration 8 is correspondingly also designated as the secondary side. The designations primary side and secondary sides are of a purely descriptive nature, since all the components on the secondary side can also be shifted to the primary side if all the components on the primary side are shifted to the secondary side. The functioning of circuit configuration 8 remains untouched by this.

Input coil 10 is made up of two spiral-shaped coil sections connected in series in the form of two spiral-shaped circuit-board conductors 10.1, 10.2 connected in series. The winding directions of the two spiral-shaped circuit-board conductors 10.1 and 10.2 are opposite to each other. Spiral-shaped circuit-board conductors 10.1, 10.2 are preferably developed as printed circuits on a printed-circuit card. Accordingly, output coil 11 is made up of two coil sections in the form of two spiral-shaped circuit-board conductors 11.1 and 11.2 that are wound in the opposite direction. The input side and the output side spiral-shaped circuit-board conductors 10.1, 10.2, 11.1, 11.2 are preferably arranged above one another. Between them, in the axial direction, there is preferably placed the electrically insulating material of the printed-circuit card (for the arrangement of the spiral-shaped circuit-board conductors, also compare FIGS. 8 and 9).

In parallel with the terminals of output coil 11, there are two resistors $R_1$ and $R_2$ that are connected in series, whose connecting point is running at the secondary side operating potential or average potential $vdd_{SEK}$. In the case of integrated embodiments of the secondary side of circuit configuration 8, in order to minimize the number of inputs of a receiver circuit 13 or an evaluation circuit 13, and in order advantageously to detect the exceeding of the operating range of an evaluation circuit, secondary side operating voltage potential $vdd_{SEK}$ is not used directly as reference potential for the potentials at the terminals of output coil 11, but [the latter] is formed from just these potentials at the terminals of output coil 11, as the arithmetic average. In order to do this, two resistors $R_3$ and $R_4$, connected in series, are placed in parallel to output coil 11 and connected to its terminals, at their connecting point $P_2$ a potential being able to be tapped off, which in the case of the equivalence of resistors $R_3$ and $R_4$ is equal to the arithmetic average of the potentials present at the terminals of output coil 11, and is a reproduction of average potential $vdd_{SEK}$, in the case in which resistor $R_1$ is equivalent to resistor $R_3$ and resistor $R_2$ is equivalent to resistor $R_4$.

The terminals of output coil 11 are preferably connected to a voltage divider 22 which converts the potentials at the terminals into the operating range of evaluation circuit 13. Voltage divider 22 is preferably developed to be resistive, that is, it's components are resistors. Connecting point $P_2$ is also connected to a voltage divider 22, or a similar voltage divider. The potential present at connecting point $P_2$ is thus also converted to the operating range of evaluating circuit 13. The converted or divided-down potential at connecting point $P_2$ functions as reference potential for the subsequent signal evaluation.

Evaluation circuit 13 includes two comparators 23, at whose inverting inputs the reference potential is present, respectively. Comparators 23 have a transmission characteristic which includes a positive voltage offset and a positive zero shift at the input. This means that reference input voltages below a certain value, greater than 0 volt, which corresponds to the offset shift or zero shift, lead to an output state "low" and to an output voltage of 0 volt. This increases the interference immunity of evaluation circuit 13, particularly with respect to common-mode interference. For the further increase in interference immunity, the transmission characteristic of comparators 23 preferably includes a voltage hysteresis with respect to input signals.

The respective noninverting input of comparators 23 is connected to an output of voltage divider 22, via which in each case a converted or lowered potential of a terminal of output coil 11 is output.

The reference potential is tested using a range monitoring 14 for the exceeding and/or the undershooting of threshold values that are present in the form of a potential band. For this, range monitoring 14 preferably has two Schmitt triggers that are not shown. If, for instance, on account of interference signal injections, the reference potential is outside the potential band, an evaluation logic 24 of evaluation circuit 13 blocks all the signals coming in from comparators 23, and preferably sets the corresponding inputs to logical low, that is, particularly to 0 volt.

If the reference potential is within the potential band, evaluation logic 24 processes the output signals of comparators 23 in the following manner: If signals of the same polarity and/or having the same binary or logical value are present at the outputs of comparators 23, the signal value low or 0 volt is assigned to the outputs of evaluation logic 24, since the state of the output signals of comparators 23 points to a non-valid transmission of two-valued signal $U_{SIGNAL}$ that is to be transmitted. If signals of opposite polarity or logically antivalent or different binary ones are present at the outputs of comparators 23, the logical high-level or a corresponding voltage value of the one comparator 23 is forwarded to the one output of evaluation logic 24, whereas the other output of evaluation logic 24 remains at the value low or at 0 volt. If the output signal of the other comparator is at logically high, the corresponding applies for the other output of evaluation logic 24.

A filter stage 25.1, 25.2 of a filter 26 is connected to the outputs of evaluation 24, respectively, which filters out or suppresses output signals that correspond to a logical high, whose duration undershoots a specified duration. Because of this filtering in the form of a short pulse suppression, interferences and signals occurring as a result of run time effects, particularly in evaluation logic 24, are suppressed and separated from valid signals. A filter stage 25.1, 25.2 can be formed, for example, by the asymmetrical charging and discharging of a capacitance having a post-connected Schmitt trigger.

Signals not filtered out by a filter stage 25.1, whose value corresponds to a logical high, lead to a setting of memory 15 that is post-connected to filter 26. In a corresponding manner, signals at the output of the other filter stage 25.2, which correspond to a logical high, lead to a resetting of memory 15.

The reconstructed two-valued signal is present at the output of memory 15, as it was sent via control circuit 16 and was reconstructed by the secondary side of circuit configuration 8.

The secondary side can be developed monolithically integrated, the monolithically integrated design preferably not including output coil 11 and resistors $R_1$ and $R_2$. Because of the monolithic integration of resistors R3 and R4, the formation of the reference potential advantageously takes place independently of tolerances of external components, contacting uncertainties on a printed-circuit card and the uneven thermal stress of external resistors.

Magnetically coupled coil pair 9, via which the signal transmission takes place, is preferably executed to be planar, and provides magnetic flux guidance in a higher-permeable material (so-called core). Materials having permeabilities that are clearly greater than 1, especially ferrites and ferrite composites, are thus preferably not used.

Figure 9:
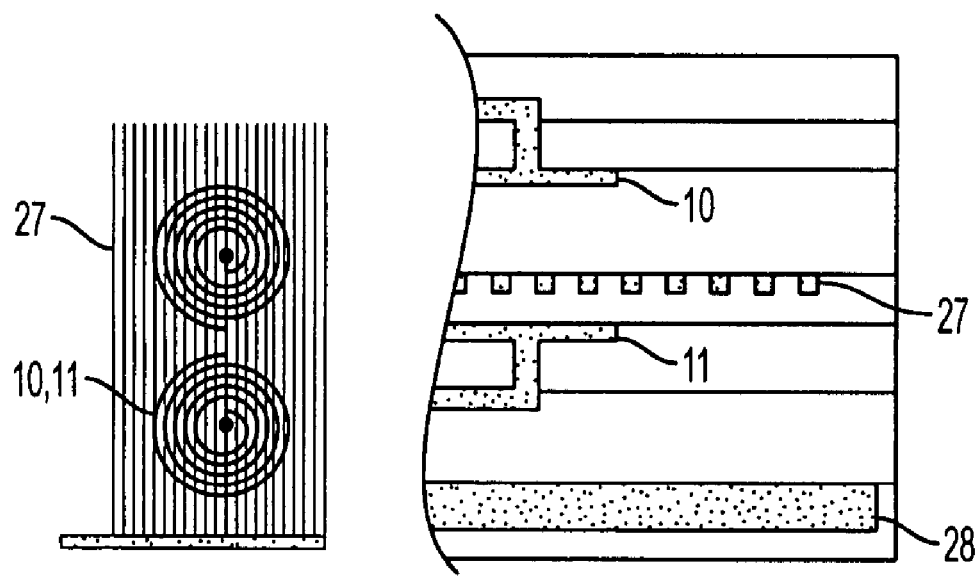
Figure 10:
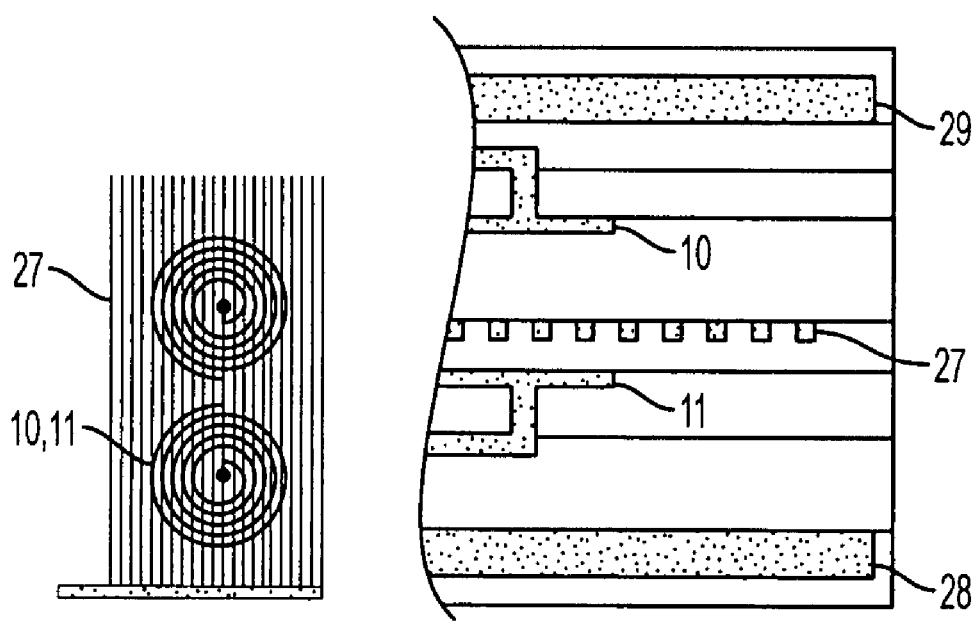

FIGS. 9 and 10 show exemplary embodiments of magnetically coupled coil pairs 9. The magnetically coupled coil pair 9 can be executed as a planar transformer in which respectively two coils 10, 11, wound in the radial direction, lie axially one over the other, coils 10, 11 being able to be executed as planar spirals which, as printed copper conducting strips, are able to lie on a dielectrically insulating carrier material, for instance fiberglass composite material FR4 (cf. left side of FIGS. 9 and 10).

The magnetically coupled coil pairs 9 shown in FIGS. 9 and 10 are each formed of an input coil 10 and an output coil 11, at the left of the figures in each case a top view being shown, and at the right in each case a cross section of the magnetically coupled coil pair 9 being shown. Input coil 10 and output coil 11 are made up in each case of coil sections in the form of spirals that are wound in the opposite direction. Between input coil 10 and output coil 11 there is situated preferably a capacitive shielding 27, which is developed as a finger-like or comb-like structure which is preferably formed by narrow copper circuit-board conductors. Capacitive shielding 27 is connected to a fixed potential which is formed, for example, reference material of the secondary side and the output side of magnetically coupled coil pair 9.

Instead of the entire capacitance present between input coil 10 and output coil 11, because of the capacitive shielding 27, only that part acts that couples to output coil 11 directly from input coil 10. This capacitance is determined by those electrical field lines which, starting from input coil 10 do not end on capacitive shielding 27. The geometric arrangement of capacitive shielding 27 is preferably such that the proportion of the field lines not ending on capacitive shielding 27 is substantially smaller than the overall number of field lines. The result is that the actual mutual capacitance between input coil 10 and output coil 11 is substantially lower than the capacitance between input coil 10 and output coil 11 without capacitive shielding 27. External interferences from a power supply system, for example, can be avoided by s small mutual capacitance. The displacement current applied to the capacitive shielding 27 by the field lines is discharged counter to the fixed potential, and thus does not act on the further processing of the voltage induced in output coil 11.

The attenuation of the magnetic field coupling from input coil 10 to output coil 11 is held low by the execution of capacitive shielding 27 as a comb-like structure having narrow conducting strip fingers, since, because of this design, eddy current losses are minimized in capacitive shielding 27.

Output coil 11 is preferably protected from magnetic interference fields which, for instance, can couple in from a power electronics system environment, using a magnetic shielding 28. Magnetic shielding 28 is provided preferably spatially close to the output coil, but not between input coil 10 and output coil 11. Accordingly, a magnetic shielding 29 for input coil 10 can be provided, which is spatially close to input coil 10, but not between the input coil and output coil 11. Magnetic shieldings 28, 29 are preferably executed as massive copper areas. The eddy currents, caused by a possibly coupling in magnetic pulsating field of the system environment in the massive copper areas of the magnetic shieldings 28, 29, shield the direct environment of the magnetic shieldings 28, 29. The shielding efficiency at a given frequency of an interference coupling in can be determined via the thickness of the copper areas of magnetic shieldings 28, 29.

What is claimed is:

1. A method for transmitting a two-valued signal via a channel, the method comprising:
   generating a pulse train after a change of a signal level of the two-valued signal, the pulse train comprising at least a first pulse and an immediately following second pulse, wherein the second pulse is a same polarity as the first pulse and is generated before the first pulse fully decays, and generating, subsequent to the pulse train, a backswing.

2. The method as recited in claim 1, wherein pulses of the pulse train are output directly on top of each other.

3. The method as recited in claim 1, wherein the two-valued signal is transmitted via a potential barrier.

4. The method as recited in claim 3, wherein the potential barrier includes a magnetically coupled coil pair which has a capacitance preconnected to it on the input side.

5. The method as recited in claim 4, wherein for the generation of a pulse train, at least two driver stages, which are provided on the input side of coil pair, switch in such a way that at each switching procedure a current change of the same direction is generated by the capacitance, each current change generating a pulse of the pulse train in an output coil of the coil pair.

6. The method as recited in claim 5, wherein, in an initial state, a first driver stage outputs a first voltage value and a second driver stage outputs a second voltage value that is different from the first voltage value; after a change in the signal level the second driver stage outputs the first voltage value; and after a specified point in time, the first driver stage outputs the second voltage level.

7. The method as recited in claim 6, wherein, in the case of an increasing slope of the two-valued signal, the first voltage value is higher than the second voltage value, and in the case of a decreasing slope of the two-valued signal, the first voltage value is lower than the second voltage value.

8. The method as recited in claim 5, wherein, in an initial state, a first driver stage outputs a first voltage value and a second driver stage outputs a second voltage value that is different from the first voltage value; after a change in the signal level, the second driver stage outputs a third voltage value that is different from the first and the second voltage value; after a specified time duration, the first driver stage outputs the third voltage value; after an additional specified time duration, the second driver stage outputs the first voltage level; and after a specified time duration, the first driver stage outputs the second voltage value.

9. The method as recited in claim 8, wherein, in the case of an increasing slope of the two-valued signal, the first voltage value is greater than the third voltage value and the third voltage value is greater than the second voltage value; and in the case of a declining slope of the two-valued signal, the first voltage value is lower than the third voltage value and the third voltage value is lower than the second voltage value.

10. The method as recited in one of the preceding claims, wherein using an evaluation circuit, the potentials of the terminals of the output coil of the coil pair are in each case compared to a reference potential while generating one evaluation signal for each.

11. The method as recited in claim 10, wherein a valid signal transmission is detected in the case of evaluation signals that are in the opposite direction.

12. The method as recited in claim 11, wherein a memory stage is set or reset as a function of the evaluation signals.

13. The method as recited in claim 10, wherein the reference potential is formed by the average of the potentials of the terminals of the output coil.

14. The method as recited in claim 13, wherein the reference potential is monitored for exceeding and/or undershooting specified threshold values, the processing of the potentials of the terminals of the output coil of the coil pair being interrupted in response to an exceeding and/or an undershooting.

15. The method as recited in claim 10, wherein the evaluation signals are filtered using a filter for suppressing pulses of a specified low duration.

* * * * *